United States Patent
Annunziata et al.

(10) Patent No.: US 9,553,257 B1
(45) Date of Patent: Jan. 24, 2017

(54) LINEAR MRAM DEVICE WITH A SELF-ALIGNED BOTTOM CONTACT

(71) Applicant: International Business Machines Corporation, Armonk, NY (US)

(72) Inventors: Anthony J. Annunziata, Stamford, CT (US); Michael C. Gaidis, Wappingers Falls, NY (US); Rohit Kilaru, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/949,267

(22) Filed: Nov. 23, 2015

Related U.S. Application Data

(63) Continuation of application No. 14/755,188, filed on Jun. 30, 2015.

(51) Int. Cl.
| | |
|---|---|
| *H01L 43/02* | (2006.01) |
| *H01L 27/22* | (2006.01) |
| *H01L 43/08* | (2006.01) |
| *H01L 43/12* | (2006.01) |

(52) U.S. Cl.
CPC ............ *H01L 43/02* (2013.01); *H01L 27/222* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 7,547,559 B2* | 6/2009 | Nejad | ...................... | H01L 43/12 257/E21.665 |
| 7,893,511 B2* | 2/2011 | Ruehrig | ................ | H01L 27/222 257/421 |
| 9,006,849 B2* | 4/2015 | Guo | ........................ | H01L 43/12 257/421 |

(Continued)

OTHER PUBLICATIONS

"Anthony J. Annunziata, et al.; Linear MRAM Device With a Self-Aligned Bottom Contact"; U.S. Appl. No. 14/755,188, filed Jun. 30, 2015.

(Continued)

*Primary Examiner* — Benjamin Sandvik
(74) *Attorney, Agent, or Firm* — Cantor Colburn LLP; Vazken Alexanian

(57) ABSTRACT

A technique relates to a linear magnetoresistive random access memory (MRAM) device. A linear magnetic tunnel junction structure includes a non-magnetic tunnel barrier on top of a free layer and a reference layer on top of the non-magnetic tunnel barrier, where the linear magnetic tunnel junction structure is in a line. Bottom contacts are separated from one another by a column space while the plurality of bottom contacts are self-aligned to the linear magnetic tunnel junction structure, such that the plurality of bottom contacts are in the line with and underneath the linear magnetic tunnel junction structure. The bottom contacts abut a bottom of the linear magnetic tunnel junction structure. MRAM devices are formed by having non-conducting parts of the free layer isolating individual interfaces between the bottom contacts and the free layer. The MRAM devices are formed in the line of the linear magnetic tunnel junction structure.

10 Claims, 12 Drawing Sheets

(56) References Cited

U.S. PATENT DOCUMENTS

| | | | | |
|---|---|---|---|---|
| 2007/0228501 A1* | 10/2007 | Nakamura | ............. | B82Y 25/00 257/421 |
| 2011/0121417 A1* | 5/2011 | Li | ........................... | H01L 43/12 257/421 |
| 2012/0326250 A1* | 12/2012 | Gaidis | ..................... | H01L 43/08 257/421 |
| 2014/0295579 A1* | 10/2014 | Guo | ........................ | H01L 43/12 438/3 |
| 2015/0287907 A1* | 10/2015 | Park | ........................ | H01L 43/08 257/421 |

OTHER PUBLICATIONS

List of IBM Patents or Patent Applications Treated as Related—Date Filed: Jan. 21, 2016; 1 page.

* cited by examiner

FIG. 2
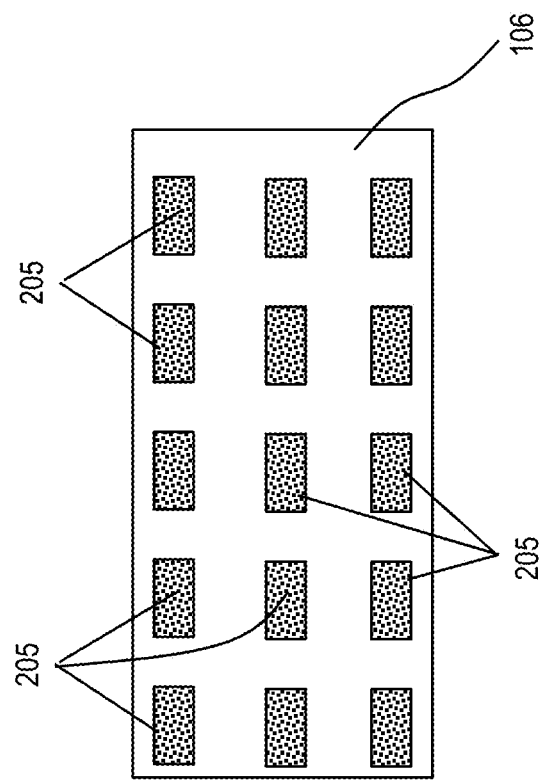
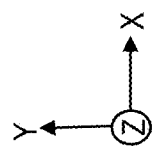

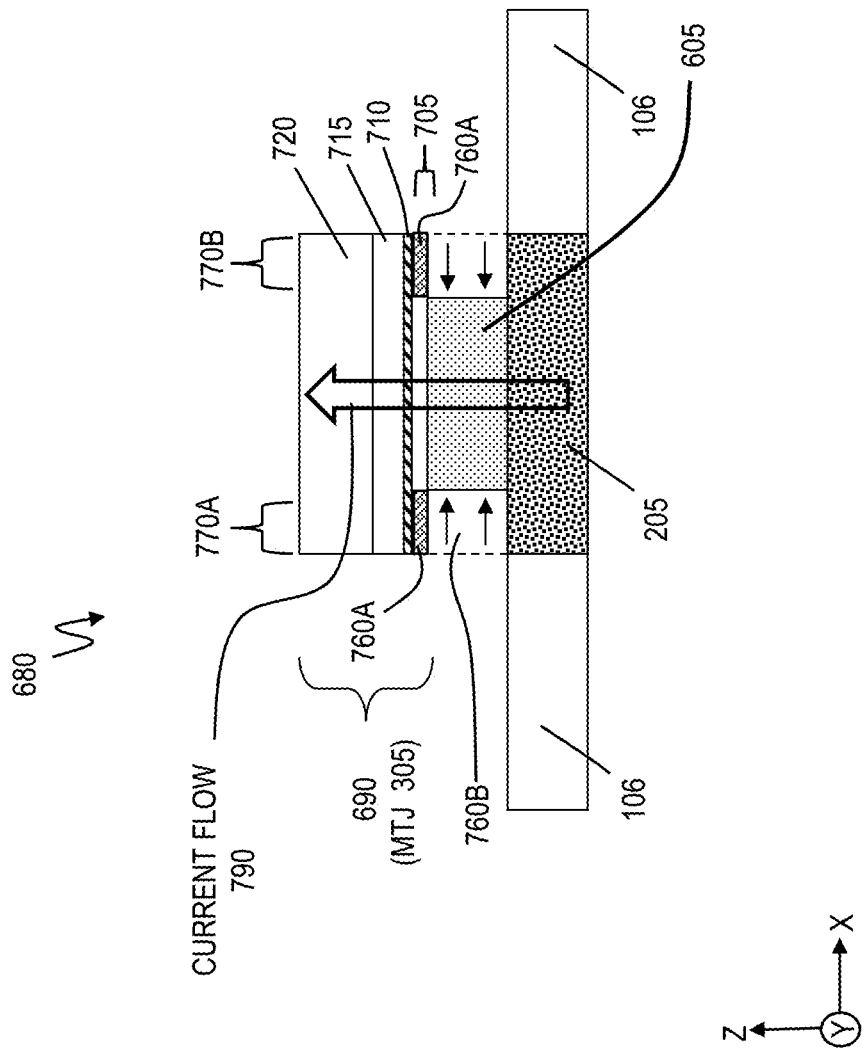

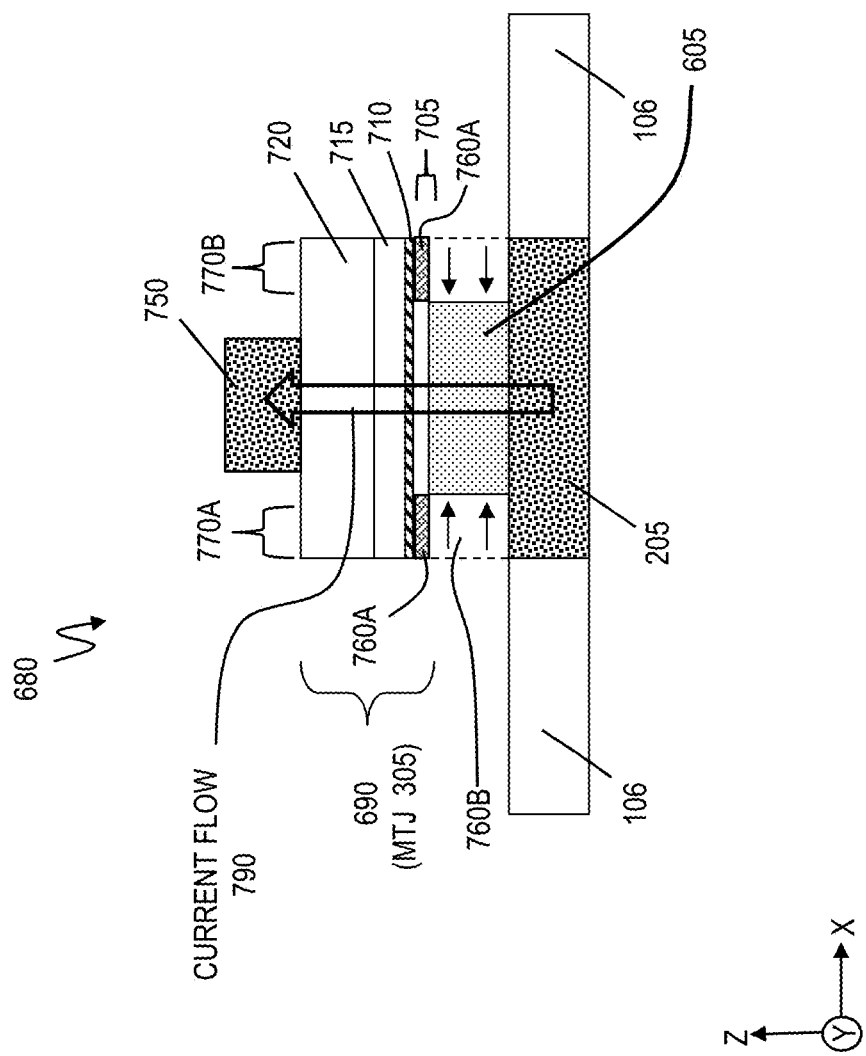

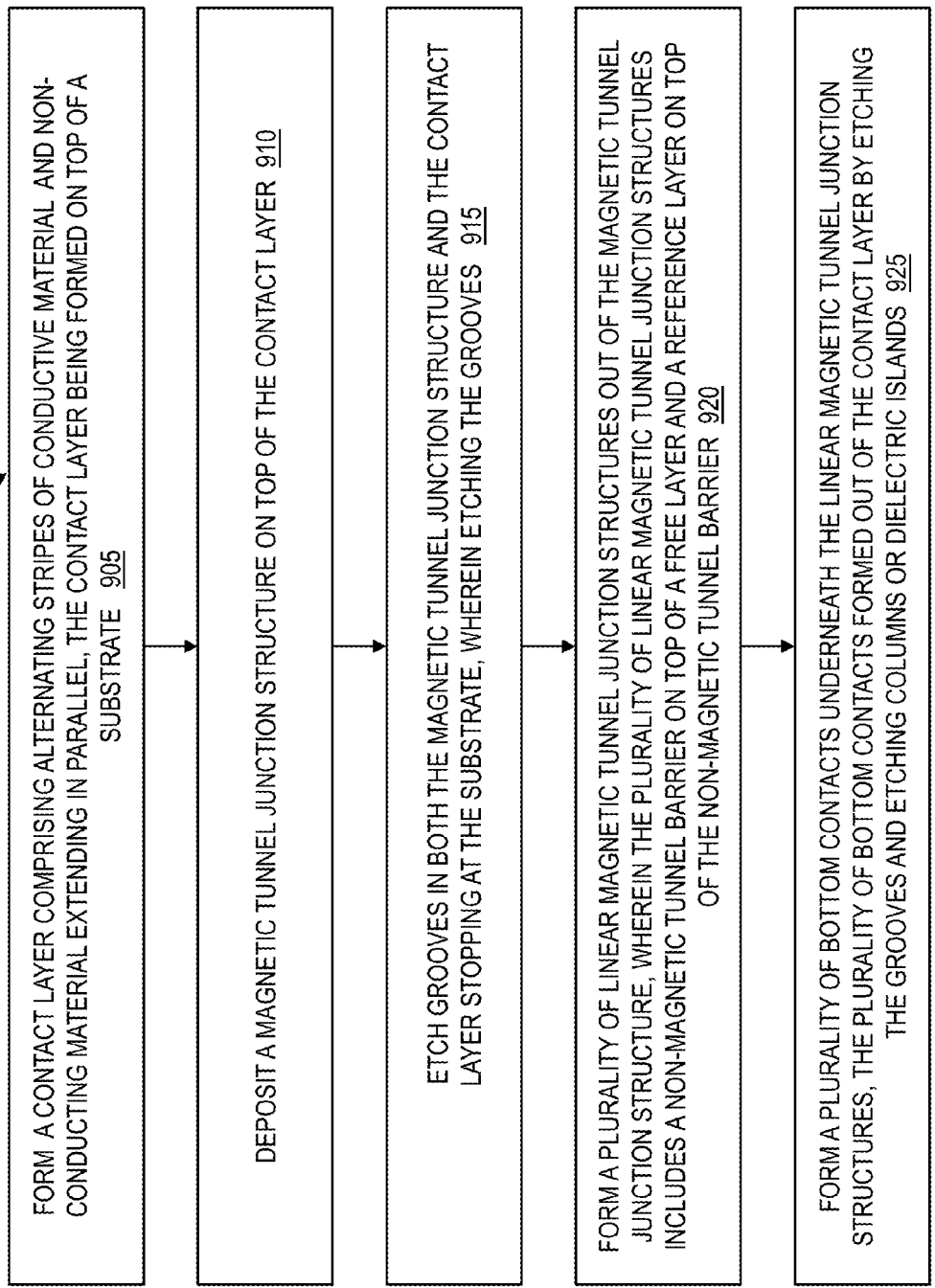

FIG. 9B

FORM THE PLURALITY OF BOTTOM CONTACTS SEPARATED FROM ONE ANOTHER BY THE GROOVES IN A FIRST DIRECTION AND BY THE COLUMNS (OR DIELECTRIC ISLANDS) IN A SECOND DIRECTION, WHILE THE PLURALITY OF BOTTOM CONTACTS ARE SELF-ALIGNED TO THE PLURALITY OF LINEAR MAGNETIC TUNNEL JUNCTION STRUCTURES, WHERE THE PLURALITY OF BOTTOM CONTACTS ABUT A BOTTOM OF THE PLURALITY OF LINEAR MAGNETIC TUNNEL JUNCTION STRUCTURES   930

FORM A PLURALITY OF MAGNETORESISTIVE RANDOM ACCESS MEMORY (MRAM) DEVICES BY HAVING NON-CONDUCTING PARTS OF THE FREE LAYER ISOLATING INDIVIDUAL INTERFACES BETWEEN THE PLURALITY OF BOTTOM CONTACTS AND THE FREE LAYER, THE PLURALITY OF MRAM DEVICES BEING FORMED IN LINES CORRESPONDING TO THE PLURALITY OF LINEAR MAGNETIC TUNNEL JUNCTION STRUCTURES   935

LINEAR MRAM DEVICE WITH A SELF-ALIGNED BOTTOM CONTACT

DOMESTIC PRIORITY

This application is a continuation of U.S. patent application Ser. No. 14/755,188, filed Jun. 30, 2015, the disclosure of which is incorporated by reference herein in its entirety.

BACKGROUND

The present invention relates to magnetic memory and magnetic storage devices, and more specifically, to linear magnetoresistive random access memory devices (MRAM) with self-aligned bottom contacts.

Unlike conventional RAM chip technologies, data in MRAM is not stored as electric charge or current flows, but by magnetic storage elements. The magnetic storage elements are formed from two ferromagnetic plates, each of which can hold a magnetization, separated by a thin insulating layer. One of the two ferromagnetic plates is a permanent magnet set to a particular polarity, while the other plate has a magnetization that can be changed to match that of an external field or that can be changed using an applied current to store memory. This configuration is known as a magnetic tunnel junction and is the simplest structure for an MRAM bit/cell. A memory device is built from a grid of such cells.

SUMMARY

According to one embodiment, a linear magnetoresistive random access memory (MRAM) device is provided. The linear magnetoresistive random access memory (MRAM) device includes a linear magnetic tunnel junction structure including a non-magnetic tunnel barrier on top of a free layer and a reference layer on top of the non-magnetic tunnel barrier, where the linear magnetic tunnel junction structure is in a line. The linear magnetoresistive random access memory (MRAM) device includes a plurality of bottom contacts separated from one another by a column space while the plurality of bottom contacts are self-aligned to the linear magnetic tunnel junction structure, such that the plurality of bottom contacts are in the line with and underneath the linear magnetic tunnel junction structure. The plurality of bottom contacts abuts a bottom of the linear magnetic tunnel junction structure. Also, the linear magnetoresistive random access memory (MRAM) device includes a plurality of magnetoresistive random access memory (MRAM) devices formed by having non-conducting parts of the free layer isolating individual interfaces between the plurality of bottom contacts and the free layer. The plurality of MRAM devices are formed in the line of the linear magnetic tunnel junction structure.

According to one embodiment, a method of forming a linear magnetoresistive random access memory (MRAM) device is provided. The method includes forming a contact layer comprising alternating stripes of conductive material and non-conducting material extending in parallel, where the contact layer is formed on top of a substrate, depositing a magnetic tunnel junction layer on top of the contact layer, and etching grooves in both the magnetic tunnel junction layer and the contact layer stopping at the substrate. Etching the grooves forms a plurality of linear magnetic tunnel junction structures out of the magnetic tunnel junction layer, where the plurality of linear magnetic tunnel junction structures includes a non-magnetic tunnel barrier on top of a free layer and a reference layer on top of the non-magnetic tunnel barrier. Etching the grooves forms a plurality of bottom contacts underneath the plurality of linear magnetic tunnel junction structures, where the plurality of bottom contacts are formed out of the contact layer by etching the grooves and islands of dielectric. Etching the grooves forms the plurality of bottom contacts separated from one another by the grooves in a first direction and by the islands of dielectric in a second direction, while the plurality of bottom contacts are self-aligned to the plurality of linear magnetic tunnel junction structures. The plurality of bottom contacts abuts a bottom of the plurality of linear magnetic tunnel junction structures. Also, the method includes forming a plurality of magnetoresistive random access memory (MRAM) devices by having non-conducting parts of the free layer isolating individual interfaces between the plurality of bottom contacts and the free layer. The plurality of MRAM devices are formed in lines corresponding to the plurality of linear magnetic tunnel junction structures.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 is a bottom view of the substrate illustrating conductive vias arranged in a pattern according to an embodiment;

FIG. 7A is a cross-sectional view illustrating further details of one MRAM device according to an embodiment;

FIG. 7B is a cross-sectional view illustrating further details of one MRAM device according to another embodiment;

FIGS. 9A and 9B together illustrate a method of forming a linear magnetoresistive random access memory device according to an embodiment.

DETAILED DESCRIPTION

Embodiments provide a linear magnetoresistive random access memory device with self-aligned contacts below an MRAM nanowire.

Magnetoresistive random access memory (MRAM) devices offer many benefits over semiconductor based memories such as dynamic random access memory (DRAM) and flash memory. However, patterning the small MRAM devices into islands of metal at the high density and uniformity desired to compete with DRAM and flash is difficult. One of the issues encountered is edge damage due to the reactive ion etch (RIE) that is typically used to subtractively pattern the MRAM device. Another issue is in making electrical contacts to the top of these small MRAM devices. A partial solution to the first issue (i.e., edge damage) is to pattern a line instead of a dot, and this reduces the edge exposure, but it does not resolve the contacting issue. Furthermore, patterning a line instead of a dot then requires a sub-feature size via contact that is difficult to pattern and align. Reliable methods of patterning magnetic lines and aligning contacts to the lines at the high density and uniformity to compete with DRAM and flash has not yet been demonstrated.

According to embodiments, a novel patterning and contacting method is proposed for linear MRAM that addresses both of these issues. According to an embodiment, a fabrication technique is discussed below to make a linear MRAM device. FIGS. 1 through 8 illustrate an example fabrication technique according to embodiments.

Figure 1:
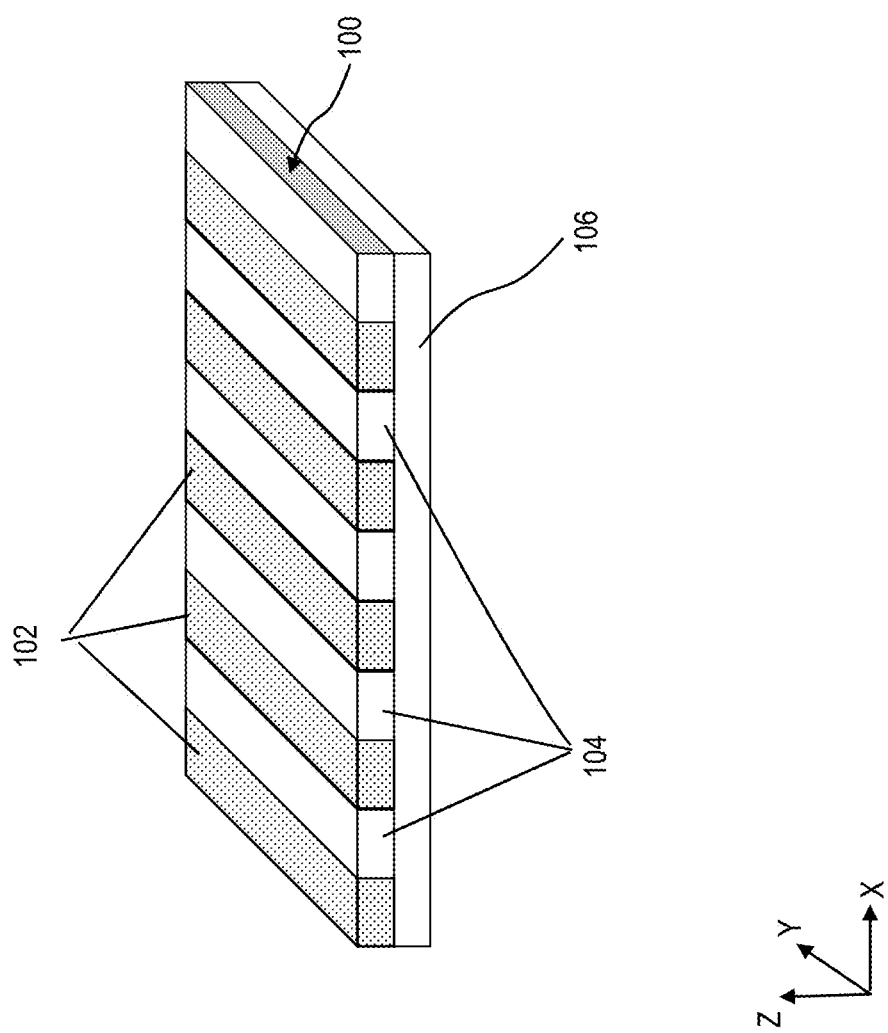
FIG. 1 is a perspective view illustrating a contact layer having conductive lines non-conductive lines on a substrate according to an embodiment.

Now turning to FIG. 1, a contact layer 100 containing conductive lines 102 is patterned using a damascene process so that the conductive lines 102 and encapsulating dielectric lines 104 are planar. The conductive lines 102 may be a metal material such that metal lines 102 (or metal wires) are formed in the contact layer 100. Although dielectric lines 104 can be made of dielectric material, in another implementation, the lines 104 may be an insulator material, a resist material, etc. The conductive lines 102 and dielectric lines 104 are stripes that run parallel to one another in the contact layer 100.

The conductive lines 102 may have a width ranging from 10 to 100 nanometers (nm) in the x-axis. The dielectric lines 104 may have a width ranging from 10 to 100 nm in the x-axis.

One skilled in the art understands the damascene process to make the conductive lines 102 and dielectric lines 104 in the contact layer 100. As one example, damascene is an additive process: first, the dielectric material of the dielectric lines 104 is deposited; second, the dielectric material is etched according to a defined photoresist pattern (and optionally, a barrier layer is deposited); third, the conductive material (e.g., metal) forming the conductive lines 102 is deposited; and last, the top surface of the contact layer 100 is planarized using, e.g., chemical mechanical polishing (CMP).

The contact layer 100 is patterned on top of a substrate 106. In one implementation, the substrate 106 may be a dielectric layer, an insulator layer, or a wafer (e.g., silicon). In the substrate 106, there may be conductive vias 205 cut through the substrate 106 (e.g., coming up from beneath) to contact the bottoms of the conductive lines 102 (metal wires) as shown in FIG. 2. FIG. 2 is a bottom view showing the underside of the substrate 106. FIG. 2 shows the conductive vias 205 arranged in a pattern (that is to (eventually) match bottom contacts 605 shown in FIG. 6). To form the conductive vias 205, holes are made through the substrate 106 and the holes are then filled with a conductive material (e.g., metal) that physically contacts the metal lines 102. As seen herein, the pattern of the conductive vias 205 corresponds to the pattern of individual MRAM devices 680 (i.e., memory bits) shown in FIGS. 6, 7A, 7B, and 8.

Figure 3:
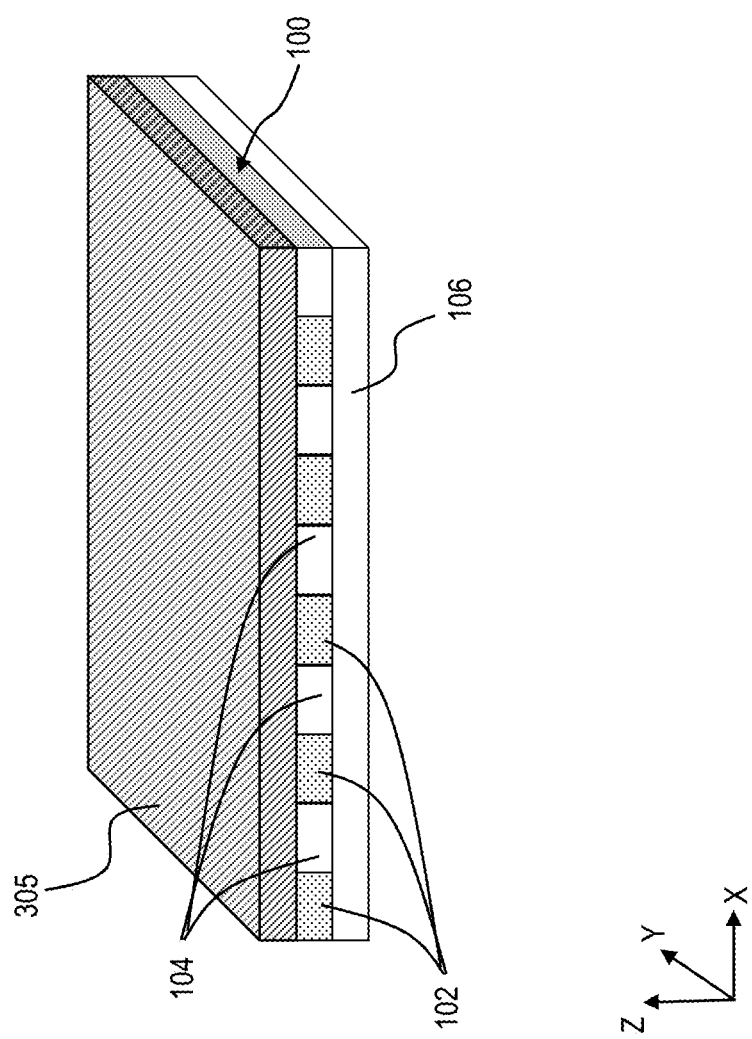
FIG. 3 illustrates that a magnetic film layer is deposited on top of the contact layer according to an embodiment.

FIG. 3 illustrates that a magnetic film layer/structure 305 is deposited on top of the contact layer 100. This magnetic film layer 305 comprises the full MRAM magnetic tunnel junction (MTJ) stack in planar layers, and accordingly, the magnetic film layer 305 comprises multiple layers not shown in FIG. 3.

Figure 8:
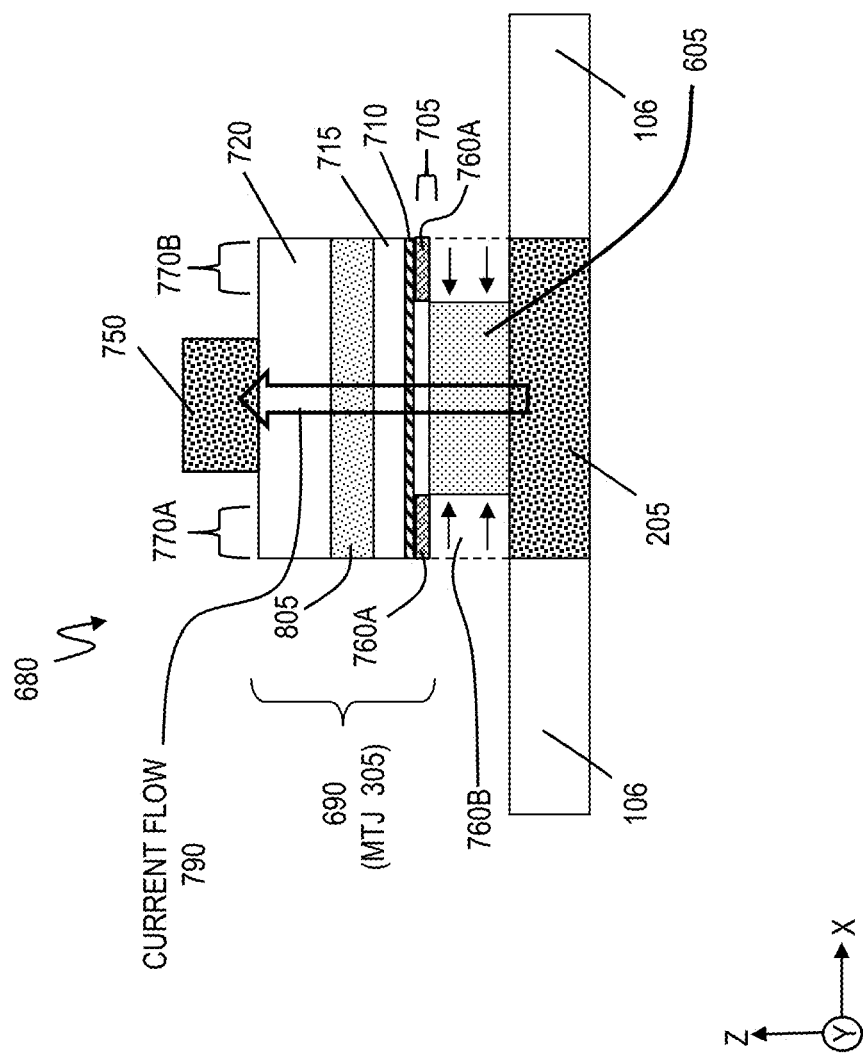
FIG. 8 is a cross-sectional view illustrating further details of one MRAM device with according to an embodiment.

Formation of magnetic film layer 305 results in MTJ stacks after patterning discussed herein. In one implementation, the MTJ stack (magnetic film layer 305) comprises a free (magnetic) layer/tunnel barrier/reference (magnetic) layer/cap/hardmask. In this implementation, the free layer is deposited on top of the contact layer 100, the tunnel barrier is deposited on top of the free layer, the reference layer is deposited on top of the tunnel barrier, the cap layer is deposited on top of the reference layer, and the hardmask is deposited on top of the cap layer (as shown in FIG. 8).

In another implementation, there may be no cap layer included the MTJ stack. In this implementation, the MTJ stack (i.e., magnetic film layer 305) comprises free (magnetic) layer/tunnel barrier/reference (magnetic) layer/hardmask. In this implementation, the free layer is deposited on top of the contact layer 100, the tunnel barrier is deposited on top of the free layer, the reference layer is deposited on top of the tunnel barrier, and the hardmask is deposited on top of the reference layer (as shown in FIGS. 7A and 7B).

Figure 4:
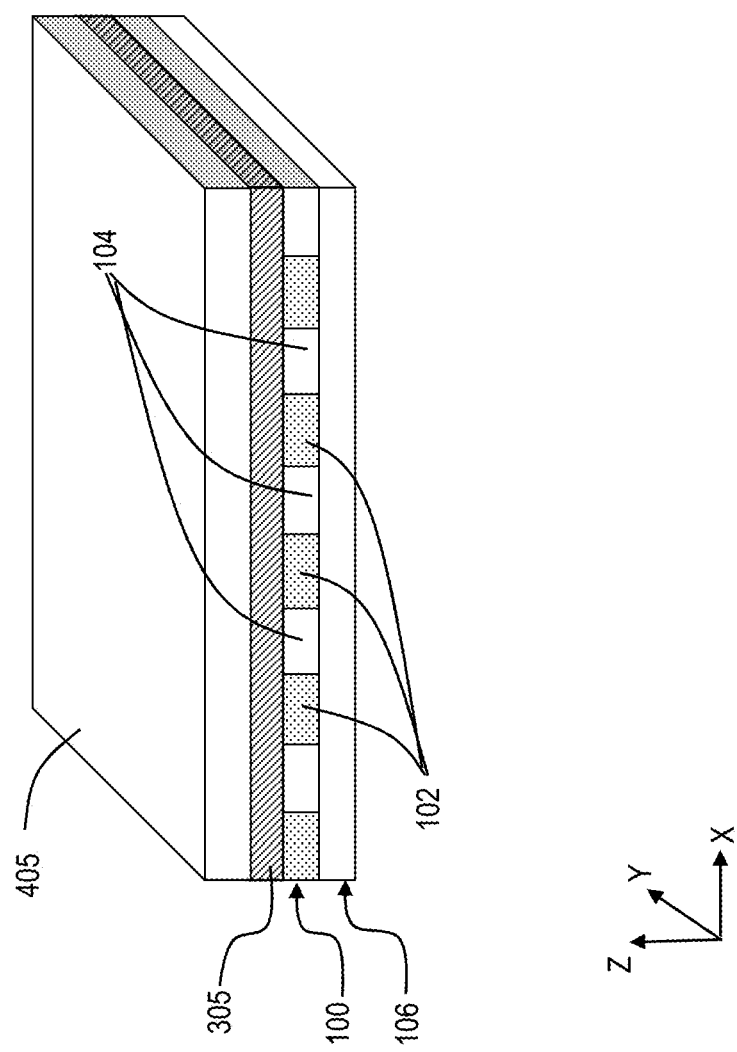
FIG. 4 illustrates that a mask is deposited on top of the magnetic film layer.
Figure 5:
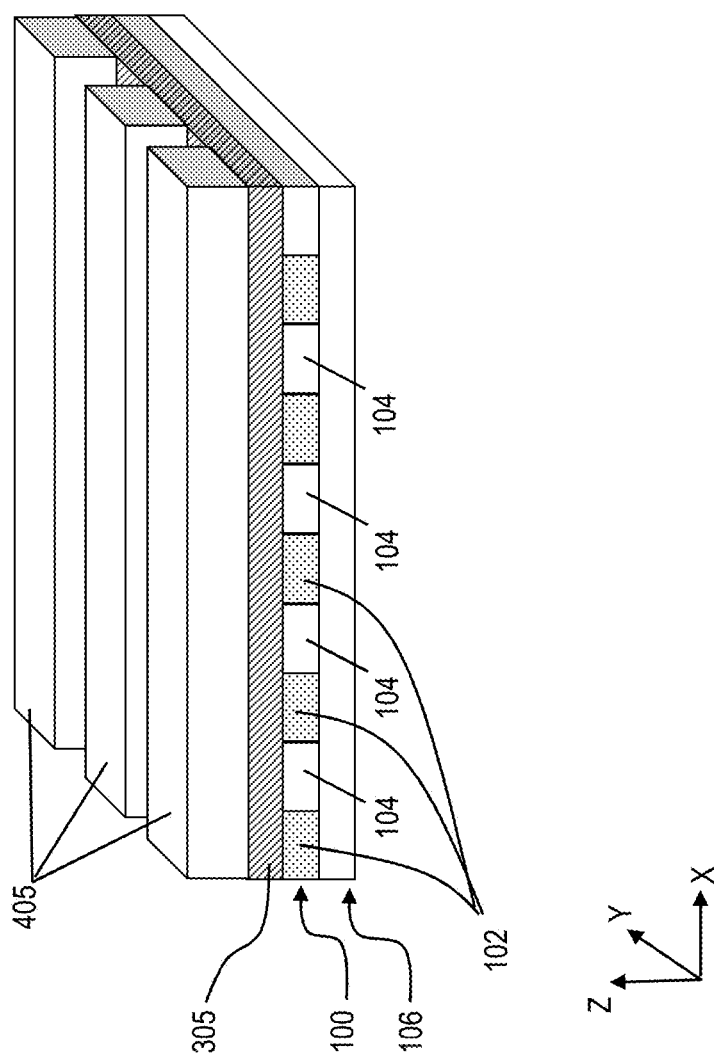
FIG. 5 illustrates patterning the mask into lines that are perpendicular to the conductive lines according to an embodiment.

FIG. 4 illustrates that a mask 405 is deposited on top of the magnetic film layer 305. The mask 405 comprises a photoresist and a hardmask not individually shown. For example, the hardmask layer is deposited on top of the magnetic film layer 305 and the photoresist layer is deposited on top of the hardmask layer. FIG. 5 shows that the photoresist and hardmask constituting the mask 405 are patterned into lines that are perpendicular to the conductive lines 102. The mask 405 may be patterned by etching as understood by one skilled in the art. The mask 405 may also contain more than the two layers mentioned (more than a single resist layer and a single hardmask layer), not individually shown in FIG. 4.

Figure 6A:
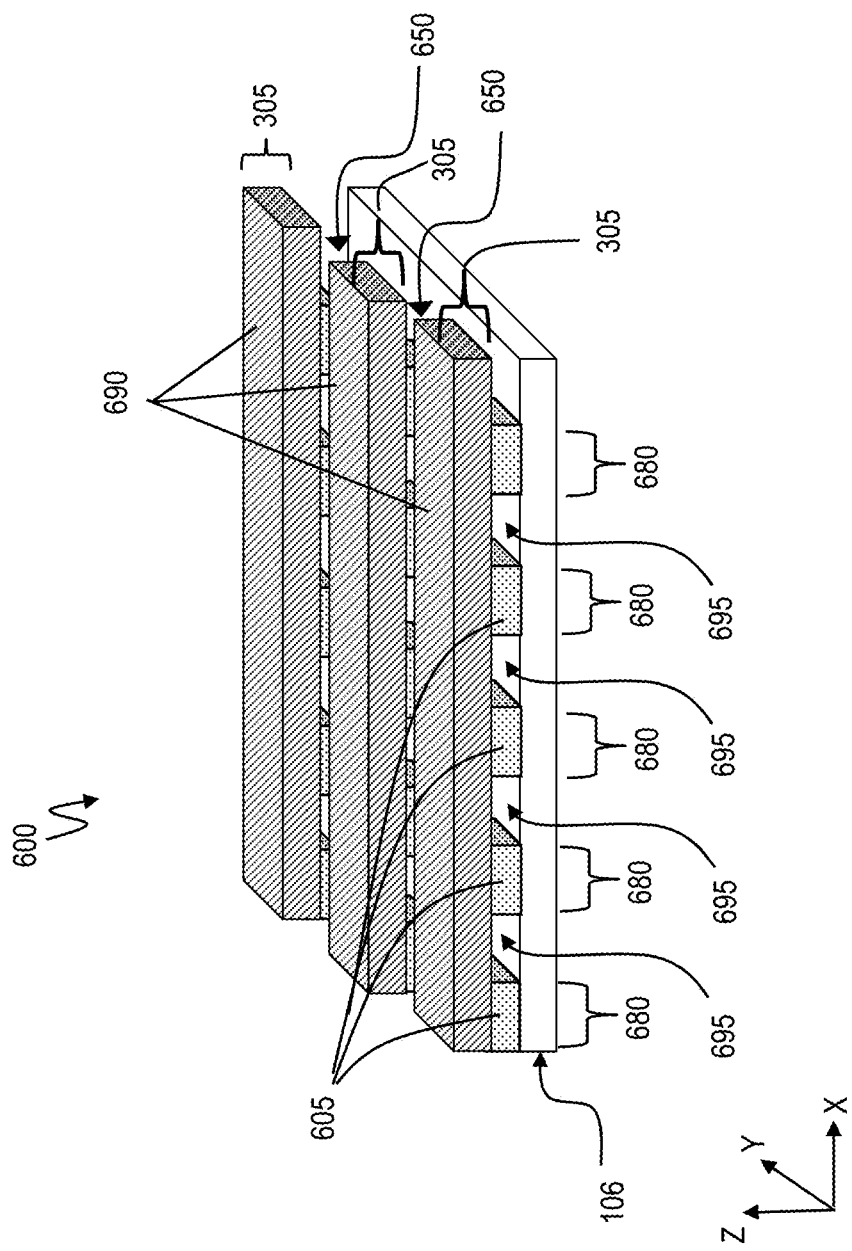
FIG. 6A is a perspective view of a linear magnetic random access memory (MRAM) device containing individual MRAM devices according to an embodiment.
Figure 6B:
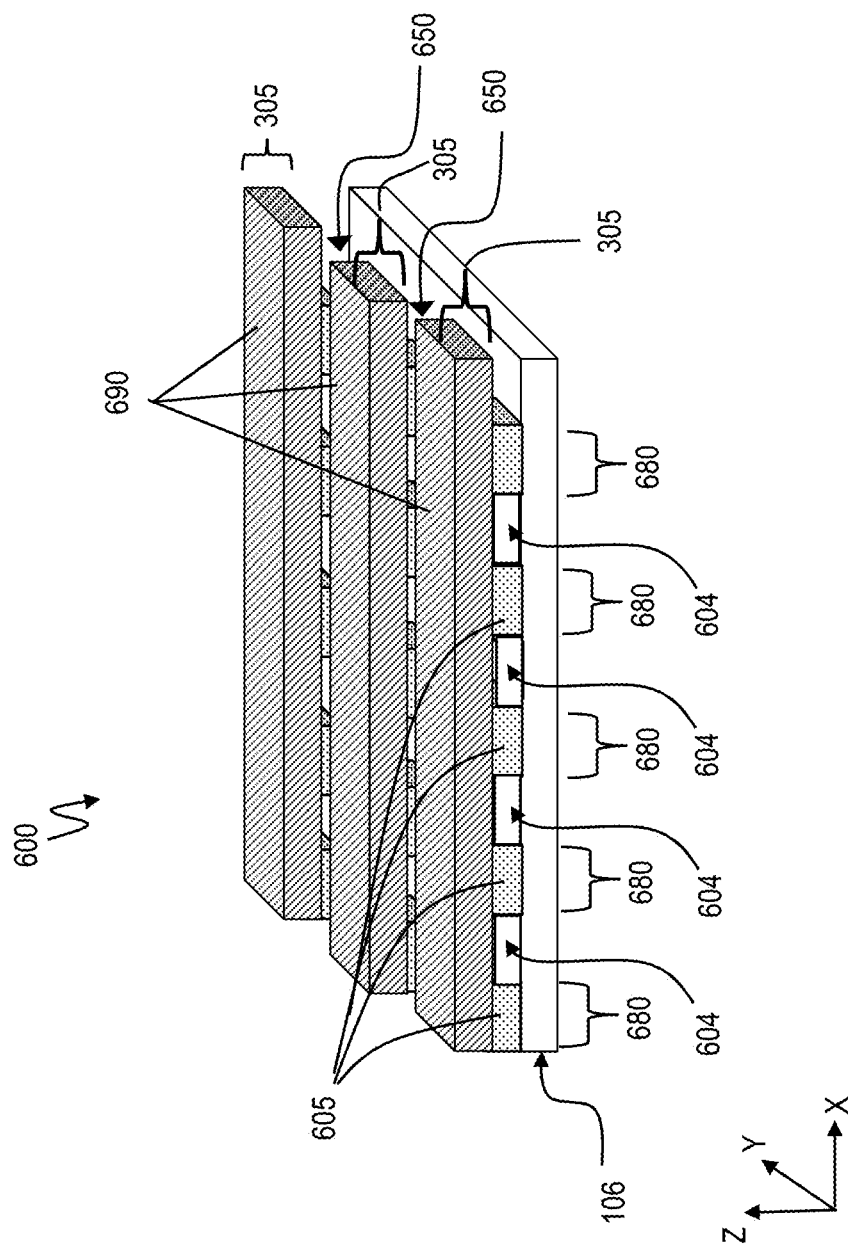
FIG. 6B is a perspective view of a linear magnetic random access memory (MRAM) device containing individual MRAM devices according to another embodiment.

FIGS. 6A and 6B show a linear magnetic random access memory (MRAM) device 600 that contains a plurality of MRAM devices 680 according to an embodiment. FIGS. 6A and 6B illustrates that the mask 405 (comprising the photoresist resist/hardmask) is used to etch through both the magnetic film layer 305 and the contact layer 100 (thereby etching the conductive lines 102 (metal wires)), stopping on the substrate 106 underneath. This etching cuts the metal lines 102 in the contact layer 100 into square islands of bottom (e.g., metal) contacts 605 underneath lines of patterned magnetic film layer 305 (MTJ layers). This etching process may remove (or dissolve) the dielectric lines 104 completely or partly, or not at all. The patterned magnetic film layer 305 results in linear magnetic tunnel junction structures 690 being directly on top of and aligned to the bottom (e.g., metal) contacts 605 underneath. That is, each bottom contact 605 is self-aligned to its own MTJ stack 305 thus forming individual MRAM devices 680 in a line, which means that each linear magnetic tunnel junction structure 690 has a plurality of MRAM devices 680. As noted earlier, each individual conductive via 205 contacts (i.e., touches) a single bottom contact 605 because the etching in FIGS. 6A and 6B leave a pattern of bottom contacts 605 corresponding to (e.g., identical to) the pattern of conductive vias 205 in FIG. 2.

There are grooves (or rows of spaces) 650 formed in a row between each of the linear magnetic tunnel junction structures 690, and the grooves 650 separate rows of MRAM devices 680. The grooves 650 separate each of the linear magnetic tunnel junction structures 690. The linear magnetic tunnel junction structures 690 are in lines or rows. In FIG. 6A, there may be columns of spaces 695 that extend through the space left from (completely or partially) removing the dielectric lines 104, but they are not essential; the dielectric lines 104 may remain as islands of dielectric 604 underneath the linear MRAM structure 305 in one implementation shown in FIG. 6B. The dielectric islands 604 are cubes of dielectric left in contact with the bottom metal contacts 605. It is noted that forming the dielectric islands 604 in FIG. 6B may be a simpler fabrication process than forming the columns of space 695 in FIG. 6B. Based on the etching to form the grooves 650 and dielectric islands 604 (or columns of space 695) in FIGS. 6A and 6B, the bottom contacts 605 are self-aligned to the linear magnetic tunnel junction structures 690, thus being self-aligned to each of the MRAM devices 680.

Although each linear magnetic tunnel junction structure 690 is shown with 5 MRAM devices 680 in a row, it is understood that each linear magnetic tunnel junction structure 690 may contain fewer and/or more MRAM devices 680. FIGS. 6A and 6B show the linear magnetic random access memory device 600 with 3 linear magnetic tunnel junction structures 690. In one implementation, the linear magnetic random access memory device 600 may include only a single linear magnetic tunnel junction structure 690 formed with its corresponding MRAM devices 680. In another implementation, the linear magnetic random access memory device 600 may include more than 3 linear magnetic tunnel junction structures 690 formed with their corresponding MRAM devices 680. The term "linear" in the linear magnetic random access memory device 600 refers to each linear magnetic tunnel junction structure 690 being a continuous line (i.e., a row).

In one implementation, this etch in FIGS. 6A and 6B may be performed in two or more steps with two or more chemistries, or can be done with a single chemistry. An example etch would be to use a reactive ion etch with a Methanol-based chemistry to etch through the magnetic layers stop on the metal and dielectric lines beneath the MRAM layers 305, followed by a second Fluorine-based reactive ion etch (for example, using CF4 gas) that etches through the metal and dielectric lines beneath the MRAM layers.

FIG. 7A is a cross-sectional view illustrating further details of an one example MRAM device 680 according to an embodiment. Although only one MRAM device 680 is shown, it is understood that the details of the MRAM device 680 apply to the other MRAM devices 680. FIG. 7A shows that the details of the MTJ stack 305 (within each linear magnetic tunnel junction structure 690) in which the MTJ stack 305 comprises the free (magnetic) layer 705 on top of the metal contact 605, the non-magnetic tunnel barrier 710 on top of the free layer 705, the reference layer 715 on top of the tunnel barrier 710, and the hardmask 720 on top of the reference layer 715. Because of the thin and reactive nature of the free layer 705 of the MRAM device, the free layer edges and parts of the free layer in between each individual MRAM device 680 become oxidized, such that they are non-conducting. The oxidized part 760A of the free (magnetic) layer 705 is shown in FIG. 7A.

In the linear magnetic tunnel junction structure 690, the oxidized part 760A serves to separate one MRAM device 680 (corresponding to layers of the MTJ stack in the linear magnetic tunnel junction structure 690) from the next MRAM device 680 beside it. Although each linear magnetic tunnel junction structure 690 contains the layers of the MTJ stack 305, the oxidized part 760A serves to electrically isolate one MRAM device 680 in the same row/line (i.e., in the same linear magnetic tunnel junction structure 690) from the next MRAM device 680. Electrical current (including tunneling current) for an individual MRAM device 680 can flow vertically in the z-axis without flowing laterally in the x-axis to affect other MRAM devices 680 in the same linear magnetic tunnel junction structure 690. The electrical current 790 is shown flowing upward in FIGS. 7A, 7B, and 8, but it is understood that electrical current 790 can also flow downward in the z-axis as desired. As one example, the electrical current 790 may flow into the conductive vias 205, through the metal/bottom contact 605, through the free (magnetic) layer 705, through the tunnel barrier 710, through the reference (magnetic) layer 715, through the non-magnetic cap 805 (shown in FIG. 8), through the hardmask 720, and out through the top contact 750 (shown in FIGS. 7B and 8).

As an option, an additional etch and/or over etch can occur in the previous etch step(s) (that form the horizontal grooves 650 and column of spaces 695 in FIG. 6A (or dielectric islands 604 in FIG. 6B), and the additional etch and/or over etch is used to undercut the free layer 705. During the fabrication process of FIGS. 6A and 6B, a reactive ion etch may be used to undercut the free layer 705 by etching out the bottom contact metal, which results in 760B being etched away and 760A becoming oxidized. Optionally, a second oxidation step after this undercutting etch step can be used to more completely oxidize the part of the free layer 760A. In this implementation, the undercutting etch and the additional oxidation result in the free layer being non-conducting near the edges of the linear MRAM device 690, and in particular non-conducting anywhere that is not in contact with the bottom conducting contact 605. As one example, plasma-enhanced oxidation is a technique that can be used to oxidize the free layer. The technique uses oxygen gas in a plasma form to promote oxidation of the free layer materials.

After undercutting the oxidized parts 760A of the free layer 705, the reduced width of the bottom contact 605 may range from 5-80 nm based on the original width (e.g., width 10-100 nm of the conductive line 102) of the bottom contact 605 before reduction. The width of the conducting via 205 may range from 10-100 nm.

FIG. 7B is a cross-sectional view illustrating that a plurality of top contacts 750 may be deposited and individually patterned on top of the hardmask 720 for each MRAM device 680. In one case, a dielectric layer (not shown) may be deposited over the entire linear magnetic random access (MRAM) device 600, and the top contacts 750 may be conductive vias formed through the deposited dielectric layer to contact the top of the hardmask 720. The top contacts may be patterned using methods known in the art, such as an additive process whereby first a dielectric is deposited, then planarized with chemical mechanical polish, and then a hole is etched in the dielectric, which aligns to the top of the MRAM device 680. This hole is then filled with a metal, for example copper, and then a second chemical mechanical polish is used to polish away metal from all areas except where the hole was etched, leaving an isolated via in electrical contact to the top of the MRAM device.

FIG. 8 is a cross-sectional view illustrating further details of one example MRAM device 680 according to another embodiment. FIG. 8 is similar to FIGS. 7A and 7B except that a non-magnetic cap layer 805 is now included in the MTJ stack 305 (within each linear magnetic tunnel junction structure 690). In this embodiment, FIG. 8 shows that the MTJ stack 305 comprises the free (magnetic) layer 705 on top of the metal contact 605, the tunnel barrier 710 on top of the free layer 705, the reference layer 715 on top of the tunnel barrier 710, the non-magnetic cap 805 on top of the reference layer 715, and the hardmask 720 on top of the non-magnetic cap 805.

Now turning to FIGS. 9A and 9B, a method 900 of forming a linear magnetoresistive random access memory (MRAM) device 600 is provided.

At block 905, a contact layer 100 comprises alternating stripes (lines) of conductive material (i.e., conductive lines 102) and non-conducting material (i.e., non-conductive lines 104) extending in parallel, and the contact layer 100 is formed on top of the substrate 106, as shown in FIG. 1.

At block 910, a magnetic tunnel junction structure/layer 305 is deposited on top of the contact layer 100, as shown in FIG. 3.

At block 915, grooves 650 are etched in both the magnetic tunnel junction structure/layer 305 and the contact layer 100 stopping at the substrate, as shown in FIGS. 6A and 6B.

At block 920, etching the grooves 650 forms a plurality of linear magnetic tunnel junction structures 690 out of the magnetic tunnel junction structure/layer 305, where the plurality of linear magnetic tunnel junction structures 690 includes a non-magnetic tunnel barrier 710 on top of a free layer 705 and a reference layer 715 on top of the non-magnetic tunnel barrier 710.

At block 925, etching the grooves 650 forms a plurality of bottom contacts 605 underneath the linear magnetic tunnel junction structures 690, and each of the plurality of bottom contacts 605 is formed out of the contact layer 100 by etching the grooves 650 and etching to leave islands of dielectric 604.

At block 930, the plurality of bottom contacts 605 are separated from one another by the grooves 650 in a first direction and by the islands of dielectric 604 in a second direction, while the plurality of bottom contacts 605 are self-aligned to the plurality of linear magnetic tunnel junction structures 690, where the plurality of bottom contacts 605 abut a bottom of the plurality of linear magnetic tunnel junction structures 690.

At block 935, a plurality of magnetoresistive random access memory (MRAM) devices are formed by having non-conducting part 760A of the free layer 705 isolating individual interfaces between the plurality of bottom contacts 605 and the free layer 705 (as shown in FIGS. 7A, 7B, 8), where the plurality of MRAM devices are formed in lines corresponding to the plurality of linear magnetic tunnel junction structures 690.

A plurality of bottom conducting vias 205 connects respectively to the plurality of bottom contacts 605.

The non-conducting parts 760A, 760B of the free layer 705 are undercut by removing portions 770A, 770B of the plurality of bottom contacts 605.

Each of the lines is a continuous line that comprises one of the plurality of linear magnetic tunnel junction structures 690.

By having the plurality of bottom contacts 605 self-aligned to the continuous line of one of the plurality of linear magnetic tunnel junction structures 690 and by having the non-conducting parts 760A, 760B of the free layer 705 isolating the individual interfaces between the plurality of bottom contacts 605 and the free layer 705, the plurality of MRAM devices 680 are individually separated (i.e., electrically) from one another.

As shown in FIG. 8, the plurality of linear magnetic tunnel junction structures 690 comprises a non-magnetic cap 805 on top of the reference layer 715, a hardmask 720 on top of the non-magnetic cap 805, and a plurality of top contacts 750 on top of the hardmask 720 top to correspond to the plurality of bottom contacts 605.

As shown in FIG. 7B, the plurality of linear magnetic tunnel junction structures 690 comprises a hardmask 720 on top of the reference layer 715, and a plurality of top contacts 750 on top of the hardmask 720 to correspond to the plurality of bottom contacts 605.

The plurality of bottom contacts 605 may comprise a metal, and the metal may include at least one of Cu, Ta, W, and TaN. The plurality of bottom contacts 605 may comprise a conducting polymer, and the conducting polymer may include at least one of polyaniline, polythiophene, and polyfluorene. The plurality of bottom contacts 605 may comprise a combination of the metal and the conducting polymer.

The contact layer 100 is a damascene layer, and the damascene layer is on top of the substrate 106. A plurality of bottom conducting vias 205 is formed through the substrate 106 to connect respectively to the plurality of bottom contacts 605 (previously conductive lines 102) in the damascene layer.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming a linear magnetoresistive random access memory (MRAM) device, the method comprising:
    forming a contact layer comprising alternating stripes of conductive material and non-conducting material extending in parallel, the contact layer being formed on top of a substrate;
    depositing a magnetic tunnel junction layer on top of the contact layer;
    etching grooves in both the magnetic tunnel junction layer and the contact layer stopping at the substrate, wherein etching the grooves:
    forms a plurality of linear magnetic tunnel junction structures out of the magnetic tunnel junction layer, wherein the plurality of linear magnetic tunnel junction structures includes a non-magnetic tunnel barrier on top of a free layer and a reference layer on top of the non-magnetic tunnel barrier;
    forms a plurality of bottom contacts underneath the plurality of linear magnetic tunnel junction structures, the plurality of bottom contacts formed out of the contact layer by etching the grooves and non-conducting material to form islands of dielectric; and
    forms the plurality of bottom contacts separated from one another by the grooves in a first direction and by the islands of dielectric in a second direction, while the plurality of bottom contacts are self-aligned to the plurality of linear magnetic tunnel junction structures, wherein the plurality of bottom contacts abut a bottom of the plurality of linear magnetic tunnel junction structures; and
    forming a plurality of magnetoresistive random access memory (MRAM) devices by having non-conducting parts of the free layer isolating individual interfaces between the plurality of bottom contacts and the free layer, the plurality of MRAM devices being formed in lines corresponding to the plurality of linear magnetic tunnel junction structures.

2. The method of claim 1, wherein a plurality of bottom conducting vias connect respectively to the plurality of bottom contacts.

3. The method of claim 1, further comprising undercutting the non-conducting parts of the free layer by removing portions of the plurality of bottom contacts.

4. The method of claim 1, wherein each of the lines is a continuous line that comprises one of the plurality of linear magnetic tunnel junction structures.

5. The method of claim 4, wherein by having the plurality of bottom contacts self-aligned to the continuous line of one of the plurality of linear magnetic tunnel junction structures and by having the non-conducting parts of the free layer isolating individual interfaces between the plurality of bottom contacts and the free layer, the plurality of MRAM devices are individually separated.

6. The method of claim 1, wherein the plurality of linear magnetic tunnel junction structures comprises a non-magnetic cap on top of the reference layer.

7. The method of claim 6, wherein the plurality of linear magnetic tunnel junction structures comprises a hardmask on top of the non-magnetic cap; and
    wherein a plurality of top contacts are on top of the hardmask top to correspond to the plurality of bottom contacts.

8. The method of claim 1, wherein the plurality of linear magnetic tunnel junction structures comprises a hardmask on top of the reference layer; and
    wherein a plurality of top contacts are on top of the hardmask to correspond to the plurality of bottom contacts.

9. The method of claim 1, wherein the plurality of bottom contacts comprises a metal, the metal including at least one of Cu, Ta, W, and TaN;
    wherein the plurality of bottom contacts comprises a conducting polymer, the conducting polymer includes at least one of polyaniline, polythiophene, and polyfluorene; or
    wherein the plurality of bottom contacts comprises a combination of the metal and the conducting polymer.

10. The method of claim 1, wherein the contact layer is a damascene layer, such that the damascene layer is on top of the substrate; and
    wherein a plurality of bottom conducting vias are formed through the substrate to connect respectively to the plurality of bottom contacts in the damascene layer.

* * * * *